(12) United States Patent
Choserot et al.

(10) Patent No.: US 12,300,310 B2
(45) Date of Patent: May 13, 2025

(54) MULTI-PORT BITCELL ARCHITECTURE

(71) Applicant: Arm Limited, Cambridge (GB)

(72) Inventors: Vianney Antoine Choserot, Antibes (FR); Andy Wangkun Chen, Austin, TX (US); Yew Keong Chong, Austin, TX (US); Sriram Thyagarajan, Austin, TX (US)

(73) Assignee: Arm Limited, Cambridge (GB)

( * ) Notice: Subject to any disclaimer, the term of this patent is extended or adjusted under 35 U.S.C. 154(b) by 207 days.

(21) Appl. No.: 17/971,226

(22) Filed: Oct. 21, 2022

(65) Prior Publication Data

US 2024/0135988 A1 Apr. 25, 2024
US 2024/0233814 A9 Jul. 11, 2024

(51) Int. Cl.

| | | |
|---|---|---|
| *G11C 11/41* | (2006.01) | |
| *G11C 11/412* | (2006.01) | |
| *G11C 11/418* | (2006.01) | |
| *G11C 11/419* | (2006.01) | |

(52) U.S. Cl.
CPC .......... *G11C 11/412* (2013.01); *G11C 11/418* (2013.01); *G11C 11/419* (2013.01)

(58) Field of Classification Search
CPC ..... G11C 11/412; G11C 11/418; G11C 11/419
See application file for complete search history.

(56) References Cited

U.S. PATENT DOCUMENTS 9,721,624 B2    8/2017  Yeung et al.
2022/0230678 A1* 7/2022  Chakraborty ......... G11C 11/419

* cited by examiner

*Primary Examiner* — Xiaochun L Chen
(74) *Attorney, Agent, or Firm* — Pramudji Law Group PLLC; Ari Pramudji

(57) ABSTRACT

Various implementations described herein are related to a device having a storage node with a bitcell. The device may have a first stage that performs a first write based on an internal bitline signal, a first write wordline signal and a second write wordline signal. The first stage outputs the internal bitline signal. The device may have a second stage that receives the internal bitline signal and performs a second write of the internal bitline signal to the bitcell. The device may have a third stage with write wordline ports and write bitline ports. The third stage provides the internal bitline signal based on a selected write wordline signal from a write wordline port of the write wordline ports and based on a selected bitline signal based on a write bitline port of the write bitline ports.

20 Claims, 8 Drawing Sheets

MULTI-PORT BITCELL ARCHITECTURE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional semiconductor fabrication designs, multi-port memory designs suffer from routing congestion issues that typically penalize area layout schemes and also often cause write margin inefficiencies in common bitcell designs. Also, larger bitcell area is increasing on modern designs that typically degrade performance and increase power, which often causes additional inefficiencies in common bitcell designs. Also, higher read and write margin requirements are caused by increased sensitivity to asymmetric layouts and process variation in common bitcell designs. Further, traditional one-write/one-read bitcell designs are typically not efficient for multiple port memory applications. Therefore, to overcome the deficiencies of conventional bitcell designs, improved multi-port memory having more efficient multi-port bitcell designs are needed to improve routing congestion, reduce read/write margins, and also reduce area of integrated circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to efficient and scalable multi-port bitcell architecture designs for multi-port memory applications. Also, the multi-port bitcell architecture may be implemented as a multi-write port bitcell architecture with multi-stage write, such as, e.g., a two-stage write. Various implementations as described herein provide for area efficient bitcell designs and robust multi-write port bitcell designs that overcome deficiencies of conventional bitcell designs by improving multi-port memory with efficient multi-port bitcell designs that improve routing congestion, reduce read/write margins, and also reduce area in multi-port memory applications.

Various implementations of multi-port bitcell architecture for multi-port memory applications will now be described in detail herein with reference to FIGS. 1A-3.

Figure 1A:
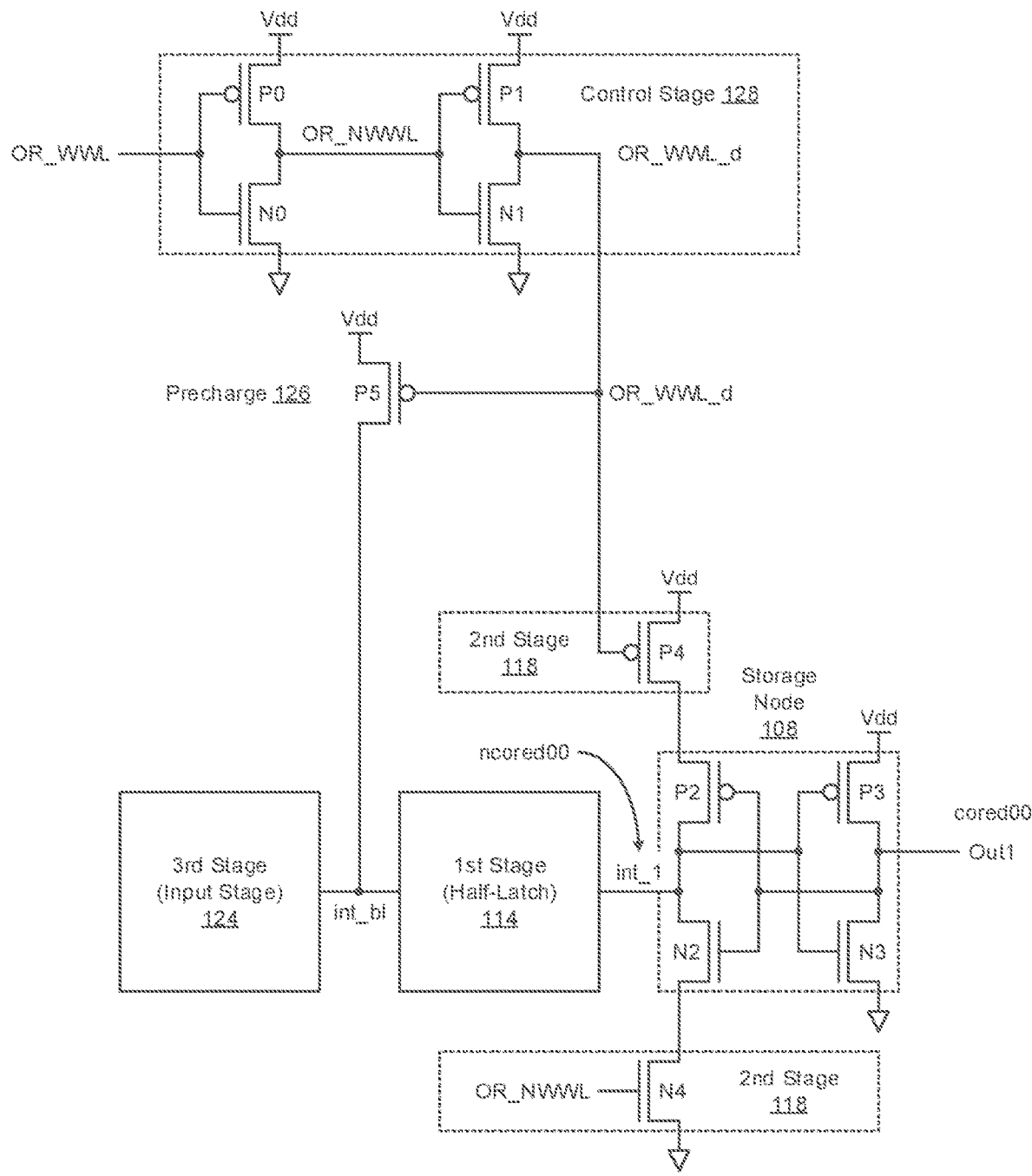
FIGS. 1A-1C illustrate diagrams of multi-port bitcell architecture for multi-port memory applications in accordance with various implementations described herein.
Figure 1B:
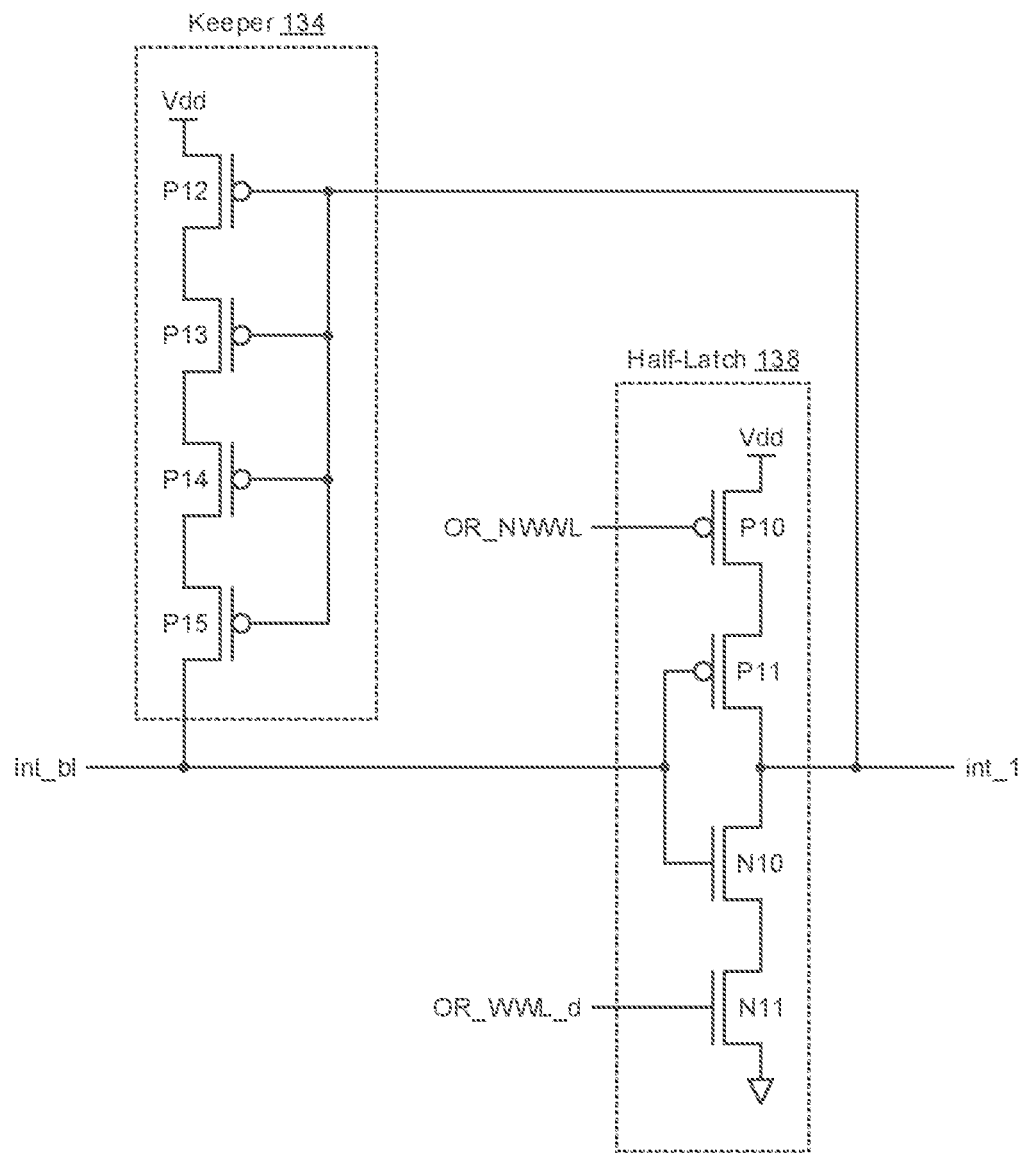
Figure 1C:
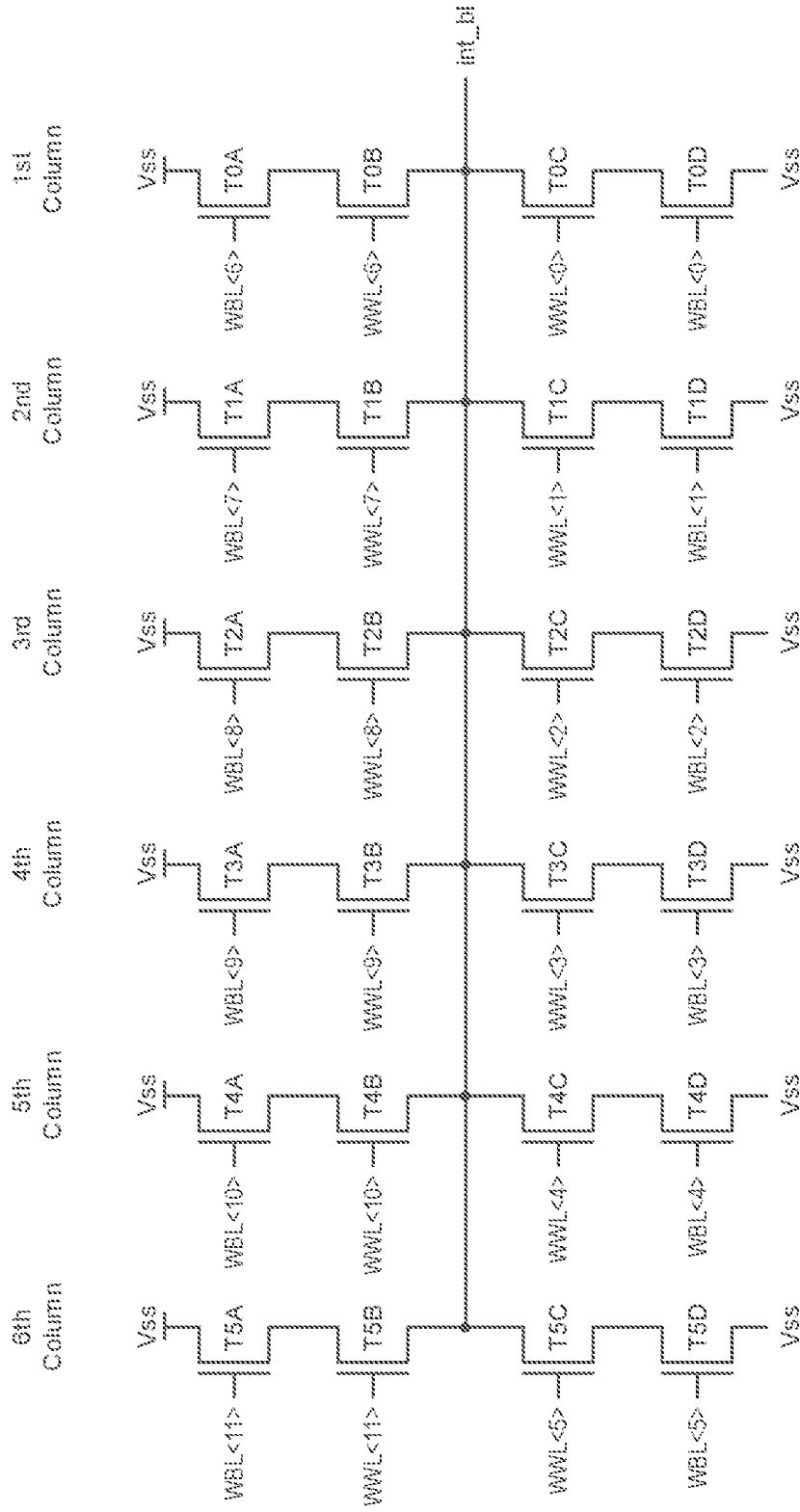

FIGS. 1A-1C illustrate diagrams of multi-port bitcell architecture for multi-port memory applications in accordance with implementations described herein. In particular, FIG. 1A shows a diagram 100B of multi-port bitcell architecture 104 with multiple stages including a first stage 114, a second stage 118, and a third stage 124. FIG. 1B shows a diagram 100B of the first stage circuitry 114 that may be configured as a half-latch, and FIG. 1C shows a diagram 100C of third stage circuitry 124 as an input stage.

In various implementations, the multi-port bitcell architecture 104 in FIGS. 1A-1C may be implemented as a system or device having integrated circuitry (IC) and various components arranged and coupled together as an assemblage or some combination of parts that may provide for physical circuit layout design and related structures. In various applications, a method of designing, fabricating, building and/or providing the multi-port bitcell architecture 104 as an integrated system or device may involve use of IC circuit components described herein so as to thereby implement various configurable multi-port bitcell architecture schemes and/or techniques associated therewith. Moreover, the multi-port bitcell architecture 104 may be integrated with various computing circuitry and related components on a single chip, and further, the multi-port bitcell architecture 104 may be implemented within various embedded systems for automotive, electronic, mobile, server and Internet-of-things (IoT) applications, including remote sensor nodes.

As shown in FIG. 1A, the multi-port bitcell architecture 104 may have multiple stages including a first stage 114 (configured as a half-latch), a second stage 118, a third stage 124 (as an input stage), and a control stage 128. The multi-port bitcell architecture 104 may also have a storage node 108 that may be configured as a multi-transistor bitcell, such as, e.g., a four-transistor (4T) tri-stated bitcell. Also, the storage node 108 may be implemented as a static random access memory (SRAM) structure that is configured to store at least one data-bit value (e.g., data value related to a logical '0' or '1').

In some implementations, the first stage 114 may be configured as a half-latch, wherein the first stage may be configured to perform a first write to a half-latch structure based on an internal bitline signal (int_1), a first write wordline signal (OR_NWWL) and a second write wordline signal (OR_WWL_d). The first stage 114 may output the internal bitline signal (int_1) as an output signal (Out1) when activated by the first write wordline signal (OR_NWWL) and the second write wordline signal (OR_WWL_d).

In some implementations, the first stage 114 may be coupled to the bitcell 108 (i.e., storage node). Also, the first stage 114 may include first write circuitry including the half-latch that receives and stores the internal bitline signal (int_1) and further performs a first stage write to the half-latch based on the internal bitline signal (int_1), the first write wordline signal (OR_NWWL) and the second write wordline signal (OR_WWL_d). Also, the first write circuitry may output the internal bitline signal (int_1) to the bitcell 108 when activated by one or more of the internal bitline signal (int_1), the first write wordline signal (OR_NWWL) and the second write wordline signal (OR_WWL_d).

In some implementations, the second stage 118 may be configured to receive the internal bitline signal (int_1) from the first stage 114 and perform a second write of the internal bitline signal (int_1) to the bitcell 108 (i.e., storage node) based on the first write wordline signal (OR_NWWL) and the second write wordline signal (OR_WWL_d).

In some implementations, the second stage 118 may be coupled to the bitcell 108 (i.e., storage node). Also, the second stage 118 may have second write circuitry (P4, N4)

that performs the second write of the internal bitline signal (int_1) to the bitcell based on the internal bitline signal (int_1), the first write wordline signal (OR_NWWL) and the second write wordline signal (OR_WWL_d).

In some implementations, the bitcell 108 (i.e., storage node) may have multiple transistors (P2/N2, P3/N3) that are coupled together as cross-coupled inverters, wherein a first inverter (P2/N2) has transistor (P2) coupled in series with transistor (N2) between transistor (P4) of the second stage 118 and transistor (N4) of the second stage 118, and wherein a second inverter (P3/N3) has transistor (P3) coupled in series with transistor (N3) between source voltage (Vdd) and ground (Vss or Gnd). Also, transistor (P4) of the second stage 118 may be coupled between the source voltage (Vdd) and transistor (P2) of the bitcell 108, and transistor (P4) of the second stage 118 may be coupled between transistor (N2) of the bitcell 108 and ground (Vss or Gnd). Also, the second write wordline signal (OR_WWL_d) may be coupled to the gate of transistor (P4) of the second stage 118 for activation thereof by the OR_WWL_d signal. Further, the first write wordline signal (OR_NWWL) may be coupled to the gate of transistor (N4) of the second stage 118 for activation thereof by the OR_NWWL signal.

In some implementations, the third stage 124 may be configured as an input stage with write wordline (WWL) ports and write bitline (WBL) ports, e.g., in a manner as shown in FIG. 1C. Also, the third stage 124 may provide the internal bitline signal (int_1) to the first stage 114 based on a selected write wordline (WWL) signal from at least one write wordline (WWL) port of the write wordline (WWL) ports and also based on a selected write bitline (WBL) signal based on at least one write bitline (WBL) port of the write bitline (WBL) ports. In some applications, the first stage 114 receives a first internal bitline signal (int_b1) from the third stage 124, and then the first stage 114 is configured to store the first internal bitline signal (int_b1) in a half-latch structure and also output the first internal bitline signal (int_b1) as a second internal bitline signal (int_1) when activated. Further, in some applications, the first stage 114 may provide the internal bitline signal (int_1) to the bitcell 108 (i.e., storage node) as ncored00 signal, and also, the bitcell 108 (i.e., storage node) may output the internal bitline signal (int_1) as cored 00 output signal (Out1).

In some implementations, the control stage 128 may be coupled to the bitcell 108 (i.e., storage node) by way of the second stage 118, wherein the control stage 128 receives an input write wordline signal (OR_WWL) and generates the first write wordline signal (OR_NWWL) and the second write wordline signal (OR_WWL_d). Also, the control stage 128 may include multiple inverters including, e.g., first inverter (P0/NO) and second inverter (P1/N1) coupled in series. The first inverter (P0/NO) may receive the input write wordline signal (OR_WWL) and generate the first write wordline signal (OR_NWWL), and the second inverter (P1/N1) may receive the first write wordline signal (OR_WWL) and generate the second write wordline signal (OR_WWL_d).

In some implementations, the first inverter (P0/NO) has transistor (P0) coupled in series with transistor (NO) between source voltage (Vdd) and ground (Vss or Gnd), and also, the second inverter (P1/N1) has transistor (P1) coupled in series with transistor (N1) between source voltage (Vdd) and ground (Vss or Gnd). The input write wordline signal (OR_WWL) may be coupled to the gates of transistors (P0, NO) for activation thereof by the OR_WWL signal, and the first inverter (P0/NO) provides the first write wordline signal (OR_NWWL) when activated by the input wordline signal (OR_WWL). Also, the first write wordline signal (OR_NWWL) may be coupled to the gates of transistors (P1, N1) for activation thereof by the OR_NWWL signal, and the second inverter (P1/N1) provides the second write wordline signal (OR_WWL_d) when activated by the first write wordline signal (OR_NWWL).

In some implementations, the second stage 118 includes the first transistor (P4) coupled between source voltage (Vdd) and the bitcell 108 (i.e., storage node), and also, the first transistor (P4) may be activated by the second write wordline signal (OR_WWL_d) and provide the source voltage (Vdd) to the bitcell 108 based on the second write wordline signal (OR_WWL_d). Also, the first transistor (P4) may be a p-type transistor. Also, the second inverter (P1/N1) of the control stage 128 outputs the second write wordline signal (OR_WWL_d) to the gate of transistor (P4) of the second stage 118.

In some implementations, the second stage 118 includes the second transistor (N4) coupled between the bitcell 108 (i.e., storage node) and ground (Vss or Gnd), and the second transistor (N4) may be activated by the first write wordline signal (OR_NWWL) and couples the bitcell 108 to ground (Vss or Gnd) based on the first write wordline signal (OR_NWWL). Also, the second transistor (N4) may be an n-type transistor. Also, the first inverter (P0/N0) of the control stage 128 outputs first write wordline signal (OR_NWWL) to the gate of transistor (N4) of the second stage 118.

In some implementations, the multi-port bitcell architecture 104 may also have a precharge transistor (P5) 126 that is coupled between the source voltage (Vdd) and the first stage 114, e.g., at node (int_b1) that is disposed between the first stage 114 and the third stage 124. Also, the precharge transistor (P5) 126 may be activated by the second write wordline signal (OR_WWL_d) and also provide the source voltage (Vdd) to the first stage 114 based on the second write wordline signal (OR_WWL_d). Also, the precharge transistor (P5) may be a p-type transistor.

In some implementations, transistors (P0, P1, P2, P3, P4, P5) may be implemented with p-type transistors, and transistors (N0, N1, N2, N3, N4) may be implemented with n-type transistors. However, in various other implementations, other configurations may be used to achieve similar results.

As shown in FIG. 1B, the first stage circuitry 114 may be implemented with a half-latch structure 138 that is coupled to the bitcell 108 (i.e., storage node). Also, in some instances, the first stage 114 may include first write circuitry including the half-latch 138 that receives and stores the internal bitline signal (int_b1) and further performs a first stage write to the half-latch 138 based on the internal bitline signal (int_b1), the first write wordline signal (OR_NWWL) and the second write wordline signal (OR_WWL_d). Further, in some instances, the first write circuitry may output the internal bitline signal (int_b1) as internal bitline signal (int_1) to the bitcell 108 when activated, e.g., by one or more of the internal bitline signal (int_b1), the first write wordline signal (OR_NWWL) and the second write wordline signal (OR_WWL_d). In various applications, the internal bitline signal (int_b1) may be similar to (or same as) the internal bitline signal (int_1) when passed or transferred to the bitcell 208 (i.e., storage node).

In some implementations, the half-latch 138 may have multiple transistors (P10, P11, N10, N11) that are coupled in series between the source voltage (Vdd) and ground (Vss or Gnd). Also, transistor (P10) may be coupled between Vdd and transistor (P11), transistor (P11) may be coupled between transistor (P10) and transistor (N10), transistor (N10) may be coupled between transistor (P11) and transistor (N11), and transistor (N11) may be coupled between transistor (N10) and ground (Vss or Gnd). Also, the first write wordline signal (OR_NWWL) may be coupled to the gate of transistor (P10) for activation thereof by the OR_NWWL signal, and the second write wordline signal (OR_WWL_d) may be coupled to the gate of transistor (N11) for activation thereof by the OR_WWL_d signal. Also, the internal bitline signal (int_b1) may be coupled to the gates of transistors (P11, N10) for activation thereof by the int_b1 signal, and the internal bitline signal (int_1) may be output from a node disposed between transistors (P11, N10).

In some implementations, the first stage 114 may include a keeper 134 coupled between the source voltage (Vdd) and an input of the half-latch 138, and the keeper 134 may be activated by the internal bitline signal (int_1) from the half-latch 138. The keeper 134 may provide source voltage (Vdd) to the input of the half-latch 138 when activated by the internal bitline signal (int_1) from the half-latch 138. Also, the keeper 134 may include multiple transistors (P12, P13, P14, P15) that are coupled in series between the source voltage (Vdd) and the input of the half-latch 138.

In some implementations, transistors (P10, P11, P12, P13, P14, P15) may be implemented with p-type transistors, and transistors (N10, N11) may be implemented with n-type transistors. However, in various other implementations, other configurations may be used to achieve similar results.

As shown in FIG. 1C, the third stage circuitry 124 may be implemented as an input structure 124 that is coupled to the first stage 114. Also, in some instances, the third stage 124 may have columns of write wordline (WWL) ports and write bitline (WBL) ports coupled to the first stage 114. In some applications, each column of write wordline (WWL) ports and write bitline (WBL) ports may provide the internal bitline signal (int_b1) to the first stage 114 when activated by the selected write wordline (WWL) signal from at least one write wordline (WWL) port of the write wordline (WWL) ports and also when activated by the selected write bitline (WBL) signal on at least one write bitline (WBL) port of the write bitline (WBL) ports.

In some implementations, a first column may include multiple sets of transistors (T0A/T0B and T0C/T0D) coupled in series between node int_b1 and ground (Vss or Gnd), such that write bitline signal (WBL<6>) is coupled to the gate of transistor (T0A), and such that write wordline signal (WWL<6>) is coupled to the gate of transistor (T0B). Also, write bitline signal (WBL<0>) is coupled to the gate of transistor (T0C), and write wordline signal (WWL<0>) is coupled to the gate of transistor (T0D).

Also, in some implementations, a second column may include multiple sets of transistors (T1A/T1B and T1C/T1D) coupled in series between node int_b1 and ground (Vss or Gnd), such that write bitline signal (WBL<7>) is coupled to the gate of transistor (T1A), and such that write wordline signal (WWL<7>) is coupled to the gate of transistor (T1B). Also, write bitline signal (WBL<1>) is coupled to the gate of transistor (T1C), and write wordline signal (WWL<1>) is coupled to the gate of transistor (T1D).

Also, in some implementations, a third column may include multiple sets of transistors (T2A/T2B and T2C/T2D) coupled in series between node int_b1 and ground (Vss or Gnd), such that write bitline signal (WBL<8>) is coupled to the gate of transistor (T2A), and such that write wordline signal (WWL<8>) is coupled to the gate of transistor (T2B). Also, write bitline signal (WBL<2>) is coupled to the gate of transistor (T2C), and write wordline signal (WWL<2>) is coupled to the gate of transistor (T2D).

Also, in some implementations, a fourth column may include multiple sets of transistors (T3A/T3B and T3C/T3D) coupled in series between node int_b1 and ground (Vss or Gnd), such that write bitline signal (WBL<9>) is coupled to the gate of transistor (T3A), and such that write wordline signal (WWL<9>) is coupled to the gate of transistor (T3B). Also, write bitline signal (WBL<3>) is coupled to the gate of transistor (T3C), and write wordline signal (WWL<3>) is coupled to the gate of transistor (T3D).

Also, in some implementations, a fifth column may include multiple sets of transistors (T4A/T4B and T4C/T4D) coupled in series between node int_b1 and ground (Vss or Gnd), such that write bitline signal (WBL<10>) is coupled to the gate of transistor (T4A), and such that write wordline signal (WWL<10>) is coupled to the gate of transistor (T4B). Also, write bitline signal (WBL<4>) is coupled to the gate of transistor (T4C), and write wordline signal (WWL<4>) is coupled to the gate of transistor (T4D).

Also, in some implementations, a sixth column may include multiple sets of transistors (T5A/T5B and T5C/T5D) coupled in series between node int_b1 and ground (Vss or Gnd), such that write bitline signal (WBL<11>) is coupled to the gate of transistor (T5A), and such that write wordline signal (WWL<11>) is coupled to the gate of transistor (T5B). Also, write bitline signal (WBL<5>) is coupled to the gate of transistor (T5C), and write wordline signal (WWL<5>) is coupled to the gate of transistor (T5D).

In some implementations, each transistor in the multiple sets of transistors may be implemented with n-type transistors. However, in various other implementations, other configurations may be used to achieve similar results, wherein, e.g., each transistor in the multiple sets of transistors may be implemented with p-type transistors that are coupled between the source voltage (Vdd) and the int_b1 node.

Figure 2A:
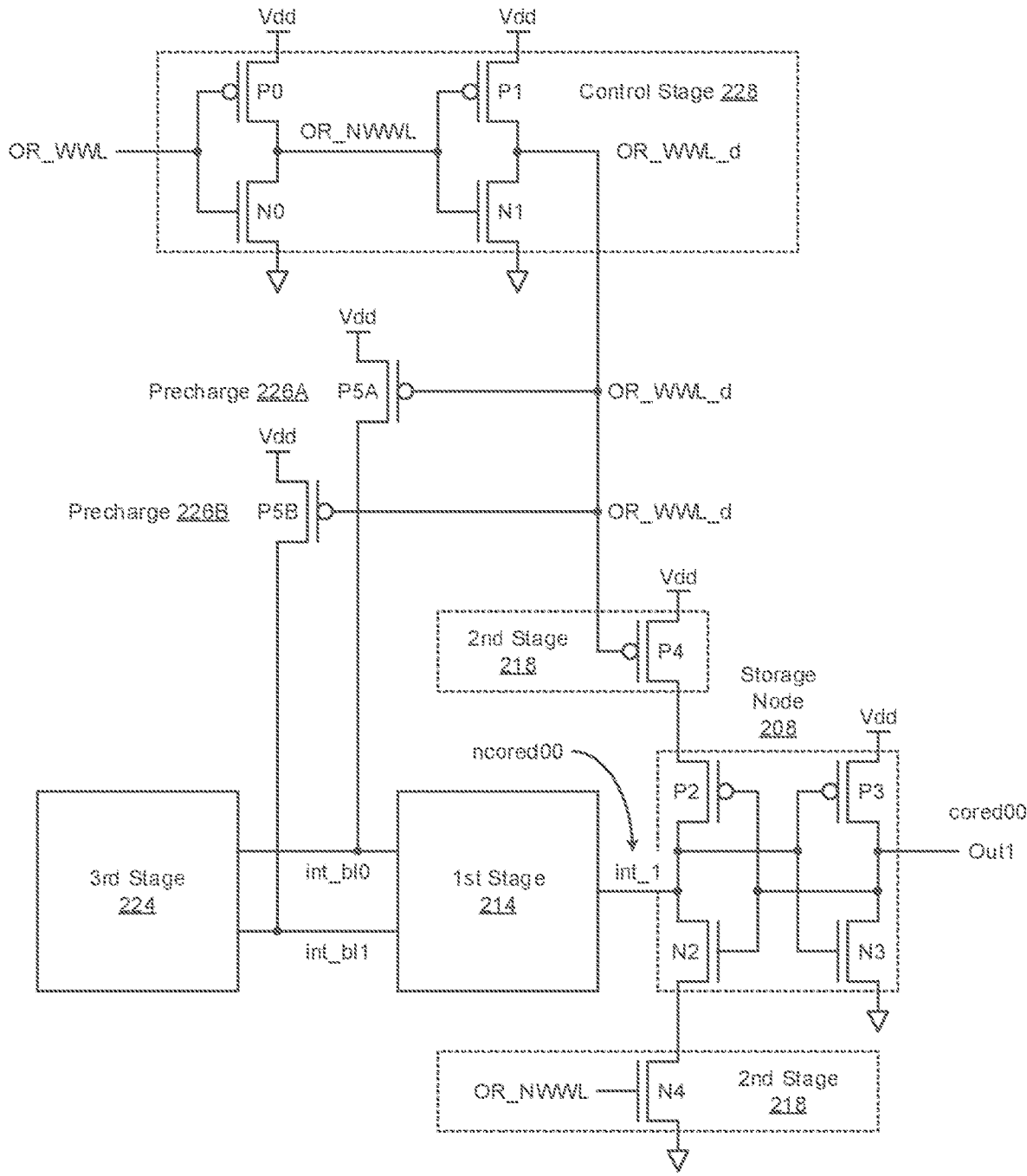
FIGS. 2A-2D illustrate diagrams of write port architecture with multiple stages in accordance with various implementations described herein.
Figure 2B:
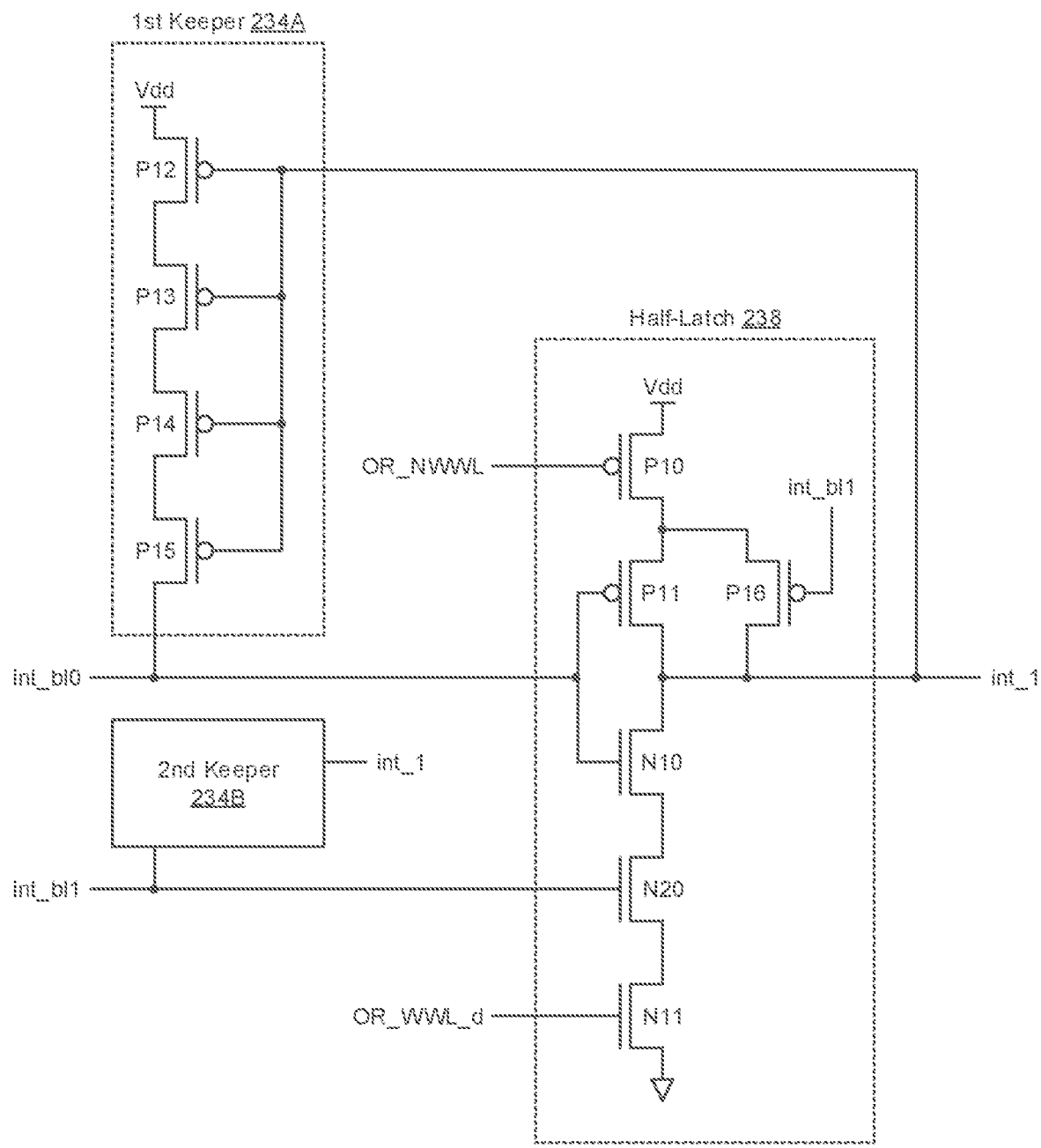
Figure 2C:
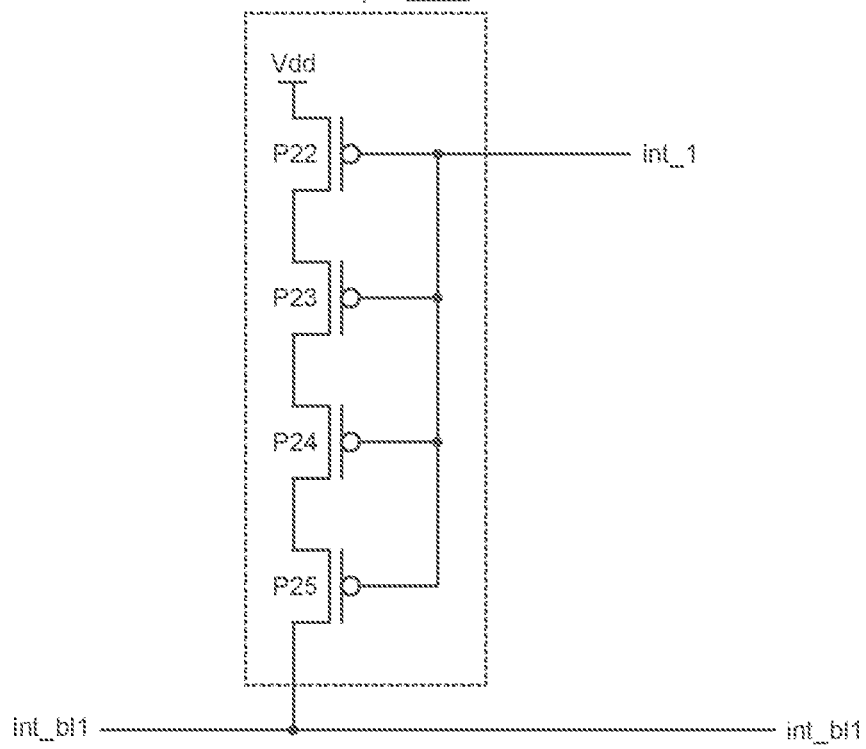
Figure 2D:
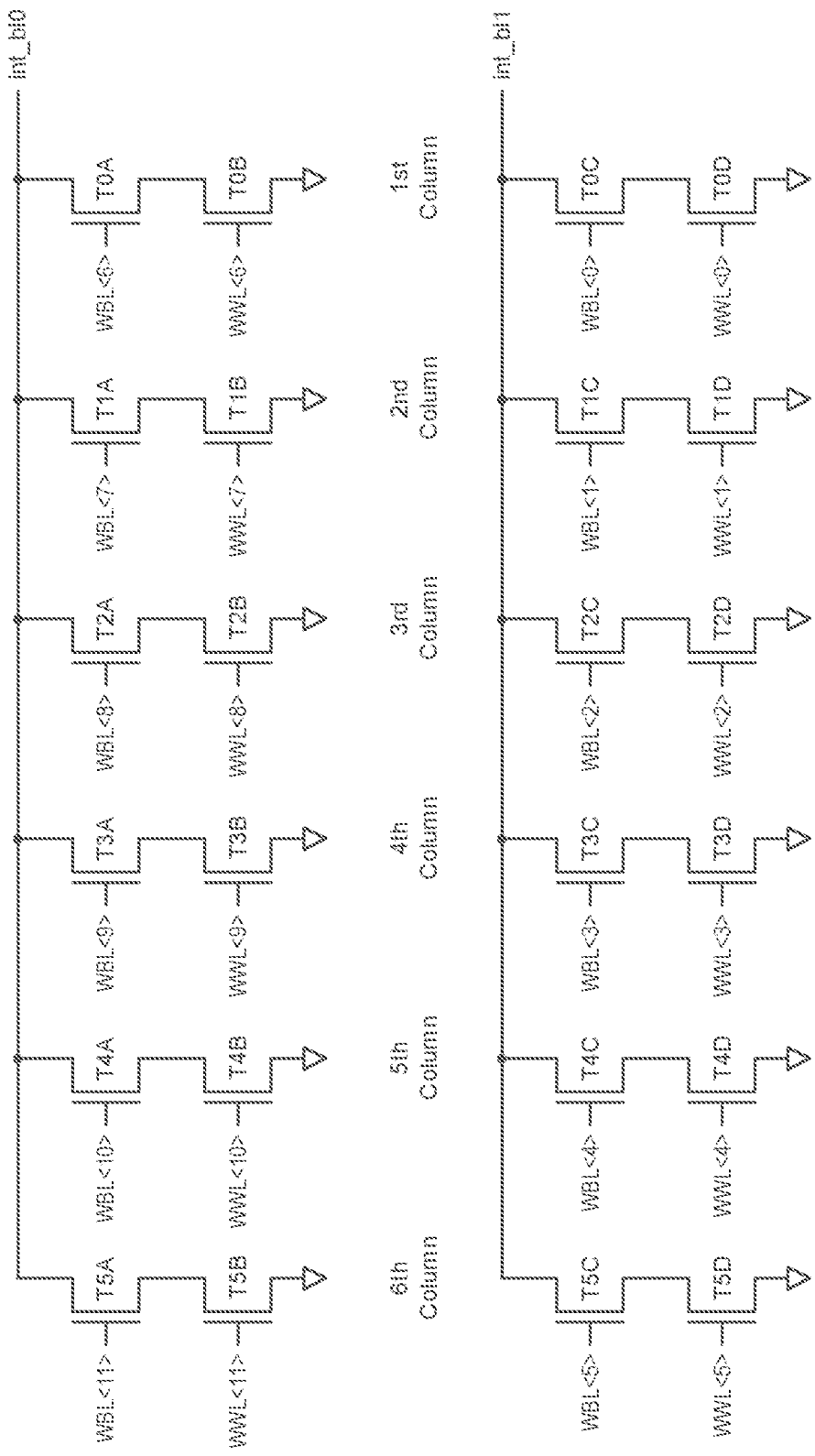

FIGS. 2A-2D illustrate diagrams of multi-port bitcell architecture for multi-port memory applications in accordance with implementations described herein. In particular, FIG. 2A shows a diagram 200B of multi-port bitcell architecture 204 with multiple stages including a first stage 214, a second stage 218, and a third stage 224. FIGS. 2B-2C show diagrams 200B, 200C of the first stage circuitry 214 that may be configured as a half-latch having multiple keeper circuits 234A, 234B. Also, FIG. 2D shows a diagram 200D of third stage circuitry 224 as an input stage. Various features, circuits, components and devices shown in FIGS. 2A-2D may be similar on scope, function and/or operation as similar corresponding features, circuits, components and devices as shown in FIGS. 1A-1C without departing from concepts, schemes and techniques described herein.

In various implementations, the multi-port bitcell architecture 204 in FIGS. 2A-2D may be implemented as a system or device having integrated circuitry (IC) and various components arranged and coupled together as an assemblage or some combination of parts that may provide for physical circuit layout design and related structures. In various applications, a method of designing, fabricating, building and/or providing the multi-port bitcell architecture 204 as an integrated system or device may involve use of IC circuit components described herein so as to thereby implement various configurable multi-port bitcell architecture schemes and/or techniques associated therewith. Moreover, the multi-port bitcell architecture 204 may be integrated with various computing circuitry and related components on a single chip, and further, the multi-port bitcell architecture 204 may be implemented within various embedded systems for automotive, electronic, mobile, server and Internet-of-things (IoT) applications, including remote sensor nodes.

As shown in FIG. 2A, the multi-port bitcell architecture 204 includes a storage node 208 having a bitcell, such as, e.g., a multi-transistor bitcell that may be implemented as a four-transistor (4T) bitcell. Also, the first stage 214 may perform a first write to a half-latch based on multiple internal bitline signals (int_bl0, int_bl1) and multiple write wordline signals (OR_NWWL, OR_WWL_d), and the first stage 214 may output or provide at least one of the multiple internal bitline signals (OR_NWWL, OR_WWL_d) as the internal bitline signal (int_1) signal when activated by the multiple write wordline signals (OR_NWWL, OR_WWL_d). Also, the second stage 218 may receive at least one of the multiple internal bitline signals (OR_NWWL, OR_WWL_d) from the first stage 214 (e.g., as int_1 signal) and then perform a second write of at least one of the internal bitline signals (OR_NWWL, OR_WWL_d) to the bitcell 208 (i.e., storage node) based on the multiple write wordline signals (OR_NWWL, OR_WWL_d). Also, the third stage 224 may include write wordline (WWL) ports and write bitline (WBL) ports, wherein the third stage 224 may be configured to provide the multiple internal bitline signals (int_bl0, int_bl1) to the first stage 214 based on a selected write wordline (WWL) signal from at least one write wordline (WWL) port of the write wordline (WWL) ports and based on a selected write bitline (WBL) signal based on at least one write bitline (WBL) port of the write bitline (WBL) ports.

In some implementations, the control stage 228 may be coupled to the bitcell 208 (i.e., storage node) by way of the second stage 218, wherein the control stage 228 receives an input write wordline signal (OR_WWL) and generates the first write wordline signal (OR_NWWL) and the second write wordline signal (OR_WWL_d). Also, the control stage 228 may include multiple inverters including, e.g., first inverter (P0/N0) and second inverter (P1/N1) coupled in series. The first inverter (P0/N0) may receive the input write wordline signal (OR_WWL) and generate the first write wordline signal (OR_NWWL), and the second inverter (P1/N1) may receive the first write wordline signal (OR_WWL) and generate the second write wordline signal (OR_WWL_d).

In some implementations, the multi-port bitcell architecture 104 may also have multiple precharge transistors including, e.g., a first precharge transistor (P5A) 226A and a second precharge transistor (P5B) 226B that are coupled between the source voltage (Vdd) and the first stage 214. In some applications, the first precharge transistor (P5A) 226A may be coupled between the source voltage (Vdd) and the first stage 214, e.g., at node (int_bl0) that is disposed between the first stage 214 and the third stage 224. Also, the second precharge transistor (P5B) 226B may be coupled between the source voltage (Vdd) and the first stage 214, e.g., at node (int_bl1) that is also disposed between the first stage 214 and the third stage 224. Also, in some applications, the precharge transistors (P5A, P5B) 226A, 226B may be activated by second write wordline signal (OR_WWL_d) and also provide the source voltage (Vdd) to the first stage 214 based on the second write wordline signal (OR_WWL_d). Also, in some instances, the precharge transistors (P5A, P5B) 226A, 226B may be implemented with p-type transistors.

As shown in FIG. 2B, the first stage circuitry 214 may be implemented with a half-latch structure 238 that is coupled to the bitcell 208 (i.e., storage node). Also, in some instances, the first stage 214 may include first write circuitry including the half-latch 238 that receives and stores at least one of the internal bitline signals (int_bl0, int_bl1) and further performs a first stage write to the half-latch 238 based on at least one of the internal bitline signals (int_bl0, int_bl1), the first write wordline signal (OR_NWWL) and the second write wordline signal (OR_WWL_d). Further, in some implementations, the first write circuitry may output at least one of the internal bitline signals (int_bl0, int_bl1) as the internal bitline signal (int_1) to the bitcell 208 when activated, e.g., by one or more of the internal bitline signals (int_bl0, int_bl1), the first write wordline signal (OR_NWWL) and the second write wordline signal (OR_WWL_d). In various applications, the internal bitline signals (int_bl0, int_bl1) may be similar to (or the same as) the internal bitline signal (int_1) when passed or transferred to the bitcell 208 (i.e., storage node).

In some implementations, the half-latch 238 may have multiple transistors (P10, P11, N10, N11 and N20) that are coupled in series between the source voltage (Vdd) and ground (Vss or Gnd). Also, transistor (P10) may be coupled between Vdd and transistor (P11), transistor (P11) may be coupled between transistor (P10) and transistor (N10), transistor (N10) may be coupled between transistor (P11) and transistor (N20), transistor (N20) may be coupled between transistor (N10) and transistor (N11), and transistor (N11) may be coupled between transistor (N10) and ground (Vss or Gnd). Also, the first write wordline signal (OR_NWWL) may be coupled to the gate of transistor (P10) for activation thereof by the OR_NWWL signal, and the second write wordline signal (OR_WWL_d) may be coupled to the gate of transistor (N11) for activation thereof by the OR_WWL_d signal. Also, the internal bitline signal (int_bl0) may be coupled to the gates of transistors (P11, N10) for activation thereof by the int_bl0 signal, and also, the internal bitline signal (int_bl1) may be coupled to the gate of transistor (N20) for activation thereof by the int_bl1 signal. Also, at least one of the internal bitline signals (int_0, int_1) may be output from a node disposed between transistors (P11, N10).

In some implementations, the first stage 214 may include a first keeper 234A coupled between the source voltage (Vdd) and an input of the half-latch 238, e.g., at node int_bl0, which is coupled to the gates of transistors (P11, N10), and the first keeper 234A may be activated by the internal bitline signal (int_1) from the half-latch 238. Also, the first keeper 234A may provide source voltage (Vdd) to the input of the half-latch 238 when activated by the internal bitline signal (int_1) from the half-latch 238. Also, the first keeper 234 may have multiple transistors (P12, P13, P14, P15) coupled in series between source voltage (Vdd) and the input of the half-latch 238, e.g., at the int_bl0 node.

Also, in some implementations, the first stage 214 may include a second keeper 234B coupled to the input of the half-latch 238, e.g., at node int_bl1, which is coupled to the gate of transistor (N20), and the second keeper 234B may be activated by the internal bitline signal (int_1) from the half-latch 238.

In some applications, FIG. 2C shows a diagram 200C of the second keeper 234B of the first stage circuitry 214 in FIG. 2B. In some implementations, the first stage 214 may include the second keeper 234B coupled between the source voltage (Vdd) and the input of half-latch 238, e.g., at node int_b11, which is coupled to the gate of transistor (N20), and also, the second keeper 234B may be activated by internal bitline signal (int_1) from the half-latch 238. Also, the second keeper 234B may provide source voltage (Vdd) to the input of the half-latch 238 when activated by the internal bitline signal (int_1) from the half-latch 238. Also, the second keeper 234B may include multiple transistors (P22, P23, P24, P25) that are coupled in series between the source voltage (Vdd) and the input of the half-latch 238, e.g., at the int_b11 node.

In some implementations, transistors (P10, P11, P12, P13, P14, P15 and P22, P23, P24, P25) may be implemented with p-type transistors, and transistors (N10, N11 and N20) may be implemented with n-type transistors. However, in various other similar implementations, other configurations may be used to achieve similar results.

As shown in FIG. 2D, the third stage circuitry 224 may be implemented as an input structure 224 that is coupled to the first stage 214. Also, in some instances, the third stage 224 may have columns of write wordline (WWL) ports and write bitline (WBL) ports coupled to the first stage 214. In some applications, each column of write wordline (WWL) ports and write bitline (WBL) ports may provide at least one of the internal bitline signals (int_bl0, int_b11) to the first stage 214 when activated by a selected write wordline (WWL) signal from at least one write wordline (WWL) port of the write wordline (WWL) ports and also when activated by the selected write bitline (WBL) signal on at least one write bitline (WBL) port of the write bitline (WBL) ports.

In some implementations, a first column may have transistors (T0A, T0B) coupled in series between node int_bl0 and ground (Vss or Gnd), such that write bitline signal (WBL<6>) is coupled to the gate of transistor (T0A), and such that write wordline signal (WWL<6>) is coupled to the gate of transistor (T0B). Also, the first column may have transistors (T0C, T0D) coupled in series between node int_b11 and ground (Vss or Gnd), such that write bitline signal (WBL<0>) is coupled to the gate of transistor (T0C), and write wordline signal (WWL<0>) is coupled to the gate of transistor (T0D).

Also, in some implementations, a second column may have transistors (T1A, T1B) coupled in series between node int_bl0 and ground (Vss or Gnd), such that write bitline signal (WBL<7>) is coupled to the gate of transistor (T1A), and such that write wordline signal (WWL<7>) is coupled to the gate of transistor (T1B). Also, the first column may have transistors (T1C, T1D) coupled in series between node int_b11 and ground (Vss or Gnd), such that write bitline signal (WBL<1>) is coupled to the gate of transistor (T1C), and write wordline signal (WWL<1>) is coupled to the gate of transistor (T1D).

Also, in some implementations, a third column may have transistors (T2A, T2B) coupled in series between node int_bl0 and ground (Vss or Gnd), such that write bitline signal (WBL<8>) is coupled to the gate of transistor (T2A), and such that write wordline signal (WWL<8>) is coupled to the gate of transistor (T2B). Also, the first column may have transistors (T2C, T2D) coupled in series between node int_b11 and ground (Vss or Gnd), such that write bitline signal (WBL<2>) is coupled to the gate of transistor (T2C), and write wordline signal (WWL<2>) is coupled to the gate of transistor (T2D).

Also, in some implementations, a fourth column may have transistors (T3A, T3B) coupled in series between node int_bl0 and ground (Vss or Gnd), such that write bitline signal (WBL<9>) is coupled to the gate of transistor (T3A), and such that write wordline signal (WWL<9>) is coupled to the gate of transistor (T3B). Also, the first column may have transistors (T3C, T3D) coupled in series between node int_b11 and ground (Vss or Gnd), such that write bitline signal (WBL<3>) is coupled to the gate of transistor (T3C), and write wordline signal (WWL<3>) is coupled to the gate of transistor (T3D).

Also, in some implementations, a fifth column may have transistors (T4A, T4B) coupled in series between node int_bl0 and ground (Vss or Gnd), such that write bitline signal (WBL<10>) is coupled to the gate of transistor (T4A), and such that write wordline signal (WWL<10>) is coupled to the gate of transistor (T4B). Also, the first column may have transistors (T4C, T4D) coupled in series between node int_b11 and ground (Vss or Gnd), such that write bitline signal (WBL<4>) is coupled to the gate of transistor (T4C), and write wordline signal (WWL<4>) is coupled to the gate of transistor (T4D).

Also, in some implementations, a sixth column may have transistors (T5A, T5B) coupled in series between node int_bl0 and ground (Vss or Gnd), such that write bitline signal (WBL<11>) is coupled to the gate of transistor (T5A), and such that write wordline signal (WWL<11>) is coupled to the gate of transistor (T5B). Also, the first column may have transistors (T5C, T5D) coupled in series between node int_b11 and ground (Vss or Gnd), such that write bitline signal (WBL<5>) is coupled to the gate of transistor (T5C), and write wordline signal (WWL<5>) is coupled to the gate of transistor (T5D).

In some implementations, each transistor in the multiple sets of transistors may be implemented with n-type transistors. However, in various other implementations, other configurations may be used to achieve similar results, wherein, e.g., each transistor in the multiple sets of transistors may be implemented with p-type transistors that are coupled between the source voltage (Vdd) and the int_bl0, int_b11 nodes.

Figure 3:
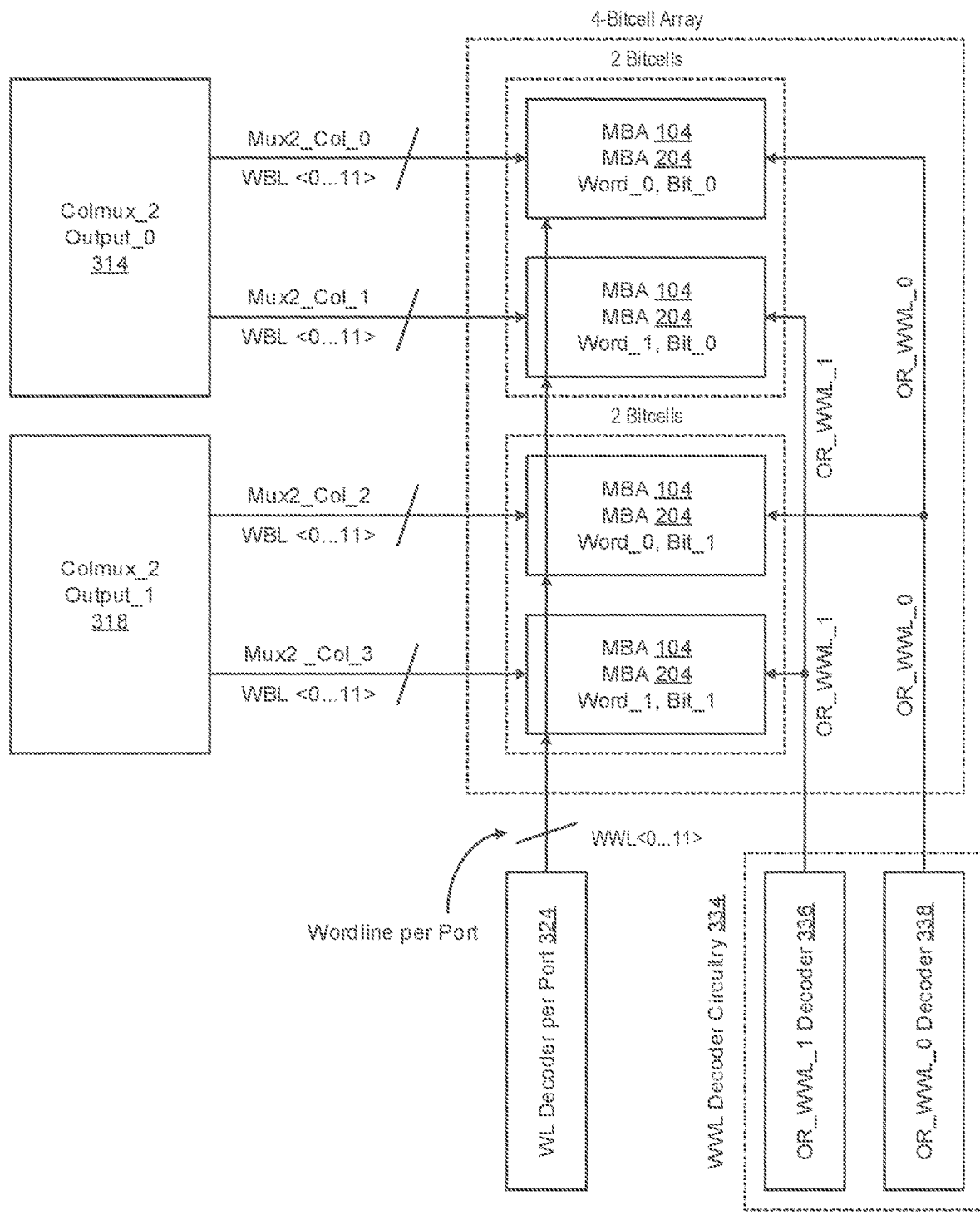
FIG. 3 illustrates a diagram of memory decoder architecture in accordance with various implementations described herein.

FIG. 3 illustrates a diagram 300 of memory decoder architecture 304 for multi-port memory applications in accordance with implementations described herein. Also, in some implementations, the multi-port memory shown in FIG. 3 may have 12 ports, such e.g., write ports <0 . . . 11>. However, in other implementations, the multi-port memory of memory decoder architecture 304 may have any number of write ports without departing from the concepts, schemes and techniques described herein.

In various implementations, the memory decoder architecture 304 in FIG. 3 may be implemented as a system or device having integrated circuitry (IC) and various components arranged and coupled together as an assemblage or some combination of parts that may provide for physical circuit layout design and related structures. In various applications, a method of designing, fabricating, building and/or providing the memory decoder architecture 304 as an integrated system or device may involve use of IC circuit components described herein so as to thereby implement various configurable multi-port bitcell architecture schemes and/or techniques associated therewith. Also, the memory decoder architecture 304 may be integrated with various computing circuitry and related components on a single chip, and further, the memory decoder architecture 304 may be implemented within various embedded systems for automotive, electronic, mobile, server and Internet-of-things (IoT) applications, including remote sensor nodes.

As shown in FIG. 3, the memory decoder architecture 304 may have memory with an array of storage nodes including a first set of storage nodes and a second set of storage nodes. In some implementations, the memory refers to a multi-bitcell array (e.g., 4-bitcell array) having a first set of storage nodes (e.g., a first 2-bitcell array for Word_0, Bit_0 and Word_1, Bit_0) and a second set of storage nodes (e.g., a second 2-bitcell array for Word_0, Bit_1 and Word_1, Bit_1). Also, each bitcell in the multi-bitcell array may refer to the multi-port bitcell architecture (MBA) 104 in FIGS. 1A-1C and/or the multi-port bitcell architecture (MBA) 204 in FIGS. 2A-2D.

Also, in some applications, the memory decoder architecture 304 may include column multiplexer circuitry 314, 318 that may provide multiple column selection signals (e.g., Mux2_Col_0, Mux2_Col_1) to the first 2-bitcell array for Word_0, Bit_0 and Word_1, Bit_0) and also multiple column selection signals (e.g., Mux2_Col_2, Mux2_Col_3) to the second set of storage nodes (e.g., a second 2-bitcell array for Word_0, Bit_1 and Word_1, Bit_1) so as to select a write wordline port (WWL<0 . . . 11>) and a write bitline port (WBL<0 . . . 11>) related to at least one storage node in the first set of storage nodes (e.g., a first 2-bitcell array for Word_0, Bit_0 and Word_1, Bit_0) and the second set of storage nodes (e.g., a second 2-bitcell array for Word_0, Bit_1 and Word_1, Bit_1).

In some implementations, the column multiplexer circuitry 314, 318 may include a first column multiplexer 314 (Columux_2 Output_0) that may provide multiple column selection signals (e.g., Mux2_Col_0, Mux2_Col_1) to the first 2-bitcell array for Word_0, Bit_0 and Word_1, Bit_0) by way of WBL<0 . . . 11> signals. Also, the column multiplexer circuitry 314, 318 may include a second column multiplexer 318 (Columux_2 Output_1) that may provide multiple column selection signals (e.g., Mux2_Col_2, Mux2_Col_3) to the second set of storage nodes (e.g., a second 2-bitcell array for Word_0, Bit_1 and Word_1, Bit_1) by way of the WBL<0 . . . 11> signals.

Also, in some applications, the memory decoder architecture 304 may include wordline decoder circuitry 324 (i.e., WL Decoder per port) that provides wordline selection signals (WWL<0 . . . 11>) to the first set of storage nodes (e.g., the first 2-bitcell array for Word_0, Bit_0 and Word_1, Bit_0) or the second set of storage nodes (e.g., the second 2-bitcell array for Word_0, Bit_1 and Word_1, Bit_1) so as to select at least one storage node in the first set of storage nodes or the second set of storage nodes.

Also, in some applications, the memory decoder architecture 304 may include write wordline decoder circuitry 334 that provides write wordline (WWL) selection signals (OR_WWL_0, OR_WWL_1) to the first set of storage nodes (e.g., a first 2-bitcell array for Word_0, Bit_0 and Word_1, Bit_0) or the second set of storage nodes (e.g., a second 2-bitcell array for Word_0, Bit_1 and Word_1, Bit_1) so as to select the at least one storage node in the first set of storage nodes or the second set of storage nodes.

In some implementations, the write wordline decoder circuitry 334 may include a first WWL decoder 336 (e.g., OR_WWL_1 Decoder) that provides a first write wordline selection signal (OR_WWL_1) to each set of storage nodes (e.g., the first 2-bitcell array and the second 2-bitcell array) so as to select at least one storage node in the storage nodes for Word_1, Bit_0 and/or Word_1, Bit_1. Also, the write wordline decoder circuitry 334 may include a second WWL decoder 338 (e.g., OR_WWL_0 Decoder) that provides a second write wordline selection signal (OR_WWL_0) to each set of storage nodes (e.g., the first 2-bitcell array and the second 2-bitcell array) so as to select at least one storage node in the storage nodes for Word_0, Bit_0 and/or Word_0, Bit_1.

In some implementations, the wordline decoder circuitry 324 may be configured to provide the wordline selection signals (WWL<0 . . . 11>) for each port in the first set of storage nodes (first 2-bitcell array for Word_0, Bit_0 and Word_1, Bit_0) and the second set of storage nodes (second 2-bitcell array for Word_0, Bit_1 and Word_1, Bit_1) so as to select the write wordline (WWL) port and the write bitline (WBL) port related to at least one storage node in the first set of storage nodes or the second set of storage nodes.

In some implementations, each bitcell in the multi-bitcell array (e.g., the 4-bitcell array) may refer to the multi-port bitcell architecture (MBA) 104 in FIGS. 1A-1C and/or the multi-port bitcell architecture (MBA) 204 in FIGS. 2A-2D. Therefore, in accordance with various applications, each bitcell in each storage node may include various features, circuits, components and/or devices shown in FIGS. 1A-1C and 2A-2D without departing from concepts, schemes and techniques described herein.

For instance, in some implementations, each bitcell in each storage node may include a first stage that performs a first write to a half-latch based on an internal bitline signal, a first write wordline signal and a second write wordline signal, wherein the first stage outputs the internal bitline signal when activated by the first write wordline signal and the second write wordline signal. Also, each bitcell in each storage node may include a second stage that receives the internal bitline signal from the first stage and performs a second write of the internal bitline signal to a bitcell based on the first write wordline signal and the second write wordline signal. Also, each bitcell in each storage node may include a third stage having write wordline ports and write bitline ports, wherein the third stage provides the internal bitline signal to the first stage based on a selected write wordline signal from at least one write wordline port of the write wordline ports and also based on a selected bitline signal based on at least one write bitline port of the write bitline ports.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with a storage node having a bitcell. The device may have a first stage that performs a first write to a half-latch based on an internal bitline signal, a first write wordline signal and a second write wordline signal. The first stage outputs the internal bitline signal when activated by the first write wordline signal and the second write wordline signal. The device may have a second stage that receives the internal bitline signal from the first stage and performs a second write of the internal bitline signal to the bitcell based on the first write wordline signal and the second write wordline signal. The device may have a third stage with write wordline ports and write bitline ports, wherein the third stage provides the internal bitline signal to the first stage based on a selected write wordline signal from at least one write wordline port of the write wordline ports and also based on a selected bitline signal based on at least one write bitline port of the write bitline ports Described herein are various implementations of a device with a storage node having a bitcell. The device may have a first stage that performs a first write to a half-latch based on multiple internal bitline signals and multiple write wordline signals, wherein the first stage outputs at least one of the multiple internal bitline signals when activated by the multiple write wordline signals. The device may have a second stage that receives at least one of the multiple internal bitline signals from the first stage and performs a second write of at least one of the internal bitline signals to the bitcell based on the multiple write wordline signals. The device may have a third stage having write wordline ports and write bitline ports, wherein the third stage provides the multiple internal bitline signals to the first stage based on a selected write wordline signal from at least one write wordline port of the write wordline ports and based on a selected bitline signal based on at least one write bitline port of the write bitline ports.

Described herein are various implementations of a device having memory with an array of storage nodes including a first set of storage nodes and a second set of storage nodes. The device may have column multiplexer circuitry that provides multiple column selection signals to the first set of storage nodes and the second set of storage nodes so as to select a write wordline port and a write bitline port related to at least one storage node in the first set of storage nodes or the second set of storage nodes. The device may have wordline decoder circuitry that provides wordline selection signals to the first set of storage nodes or the second set of storage nodes so as to select the at least one storage node in the first set of storage nodes or the second set of storage nodes. The device may have write wordline decoder circuitry that provides a first write wordline signal to the at least one storage node in the first set of storage nodes or that provides a second write wordline signal to the at least one storage node in the second set of storage nodes.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to various implementations of various schemes and techniques described herein in reference to configurable multi-port bitcell architecture for multi-port memory, various other implementations may be devised in accordance with the disclosure herein, which may be determined by the claims that follow herein below.

Although the subject matter described herein has been described in language specific to structural features and/or methodological acts, it is to be understood that the subject matter defined in the appended claims is not necessarily limited to the specific features or acts described above. Rather, specific features and acts described herein are disclosed as example forms of implementing the claims.

What is claimed is:

1. A device comprising:
 a storage node having a bitcell;
 a first stage that performs a first write to a half-latch based on an internal bitline signal, a first write wordline signal and a second write wordline signal, wherein the first stage outputs the internal bitline signal when activated by the first write wordline signal and the second write wordline signal;
 a second stage that receives the internal bitline signal from the first stage and performs a second write of the internal bitline signal to the bitcell based on the first write wordline signal and the second write wordline signal; and
 a third stage having write wordline ports and write bitline ports, wherein the third stage provides the internal bitline signal to the first stage based on a selected write wordline signal from at least one write wordline port of the write wordline ports and also based on a selected bitline signal based on at least one write bitline port of the write bitline ports.

2. The device of claim 1, wherein the bitcell is a tri-stated bitcell.

3. The device of claim 1, wherein:
 the first stage is coupled to the bitcell,
 the first stage has first write circuitry including the half-latch that receives and stores the internal bitline signal and performs a first stage write to the half-latch based on the internal bitline signal, the first write wordline signal and the second write wordline signal, and
 the first write circuitry outputs the internal bitline signal to the bitcell when activated by one or more of the internal bitline signal, the first write wordline signal and the second write wordline signal.

4. The device of claim 1, wherein:
the first stage includes a keeper coupled between a source voltage and an input of the half-latch,
the keeper is activated by the internal bitline signal from the half-latch, and
the keeper provides the source voltage to the input of the half-latch when activated by the internal bitline signal from the half-latch.

5. The device of claim 1, wherein:
the second stage is coupled to the bitcell, and
the second stage has second write circuitry that performs the second write of the internal bitline signal to the bitcell based on the internal bitline signal, the first write wordline signal and the second write wordline signal.

6. The device of claim 1, further comprising:
a control stage coupled to the bitcell by way of the second stage,
wherein the control stage receives an input write wordline signal and generates the first write wordline signal and the second write wordline signal.

7. The device of claim 6, wherein:
the control stage has multiple inverters including a first inverter and a second inverter coupled in series,
the first inverter receives the input write wordline signal and generates the first write wordline signal, and
the second inverter receives the first write wordline signal and generates the second write wordline signal.

8. The device of claim 1, wherein:
the second stage includes a first transistor coupled between a source voltage and the bitcell, and
the first transistor is activated by the second write wordline signal and provides the source voltage to the bitcell based on the second write wordline signal.

9. The device of claim 8, wherein:
the first transistor comprises a p-type transistor.

10. The device of claim 1, wherein:
the second stage includes a second transistor coupled between the bitcell and ground, and
the second transistor is activated by the first write wordline signal and couples the bitcell to ground based on the first write wordline signal.

11. The device of claim 10, wherein:
the second transistor comprises an n-type transistor.

12. The device of claim 1, further comprising:
a precharge transistor coupled between a source voltage and the first stage,
wherein the precharge transistor is activated by the second write wordline signal and provides the source voltage to the first stage based on the second write wordline signal.

13. The device of claim 1, wherein:
the third stage includes columns of write wordline ports and write bitline ports coupled to the first stage,
each column of write wordline ports and write bitline ports provides the internal bitline signal to the first stage when activated by the selected write wordline signal from at least one write wordline port of the write wordline ports and also when activated by the selected bitline signal on at least one write bitline port of the write bitline ports.

14. A device comprising:
a storage node having a bitcell;
a first stage that performs a first write to a half-latch based on multiple internal bitline signals and multiple write wordline signals, wherein the first stage outputs at least one of the multiple internal bitline signals when activated by the multiple write wordline signals;
a second stage that receives at least one of the multiple internal bitline signals from the first stage and performs a second write of at least one of the internal bitline signals to the bitcell based on the multiple write wordline signals; and
a third stage having write wordline ports and write bitline ports, wherein the third stage provides the multiple internal bitline signals to the first stage based on a selected write wordline signal from at least one write wordline port of the write wordline ports and based on a selected bitline signal based on at least one write bitline port of the write bitline ports.

15. The device of claim 14, further comprising:
a control stage coupled to the bitcell by way of the second stage,
wherein the control stage receives an input write wordline signal and generates the multiple write wordline signals.

16. The device of claim 14, further comprising:
multiple precharge transistors coupled between a source voltage and the first stage,
wherein the precharge transistors are activated by at least one of the multiple write wordline signals and provides the source voltage to the first stage when activated.

17. The device of claim 14, wherein:
the third stage includes columns of write wordline ports and write bitline ports coupled to the first stage,
each column of write wordline ports and write bitline ports provides the multiple internal bitline signals to the first stage when activated by the selected write wordline signal from at least one write wordline port of the write wordline ports and also when activated by the selected bitline signal on at least one write bitline port of the write bitline ports.

18. A device comprising:
memory having an array of storage nodes including a first set of storage nodes and a second set of storage nodes;
column multiplexer circuitry that provides multiple column selection signals to the first set of storage nodes and the second set of storage nodes so as to select a write wordline port and a write bitline port related to at least one storage node in the first set of storage nodes or the second set of storage nodes;
wordline decoder circuitry that provides wordline selection signals to the first set of storage nodes or the second set of storage nodes so as to select the at least one storage node in the first set of storage nodes or the second set of storage nodes; and
write wordline decoder circuitry that provides a first write wordline signal to the at least one storage node in the first set of storage nodes or that provides a second write wordline signal to the at least one storage node in the second set of storage nodes;
wherein the wordline decoder circuitry provides the wordline selection signals to select the write wordline port and the write bitline port.

19. The device of claim 18, wherein:
the wordline decoder circuitry provides the wordline selection signals for each port in the first set of storage nodes and the second set of storage nodes; and
the write wordline port and the write bitline port are related to at least one storage node in the first set of storage nodes or the second set of storage nodes.

20. The device of claim 18, wherein each storage node includes:
a first stage that performs a first write to a half-latch based on an internal bitline signal, a first write wordline signal and a second write wordline signal, wherein the first stage outputs the internal bitline signal when activated by the first write wordline signal and the second write wordline signal;

a second stage that receives the internal bitline signal from the first stage and performs a second write of the internal bitline signal to a bitcell based on the first write wordline signal and the second write wordline signal; and a third stage having write wordline ports and write bitline ports, wherein the third stage provides the internal bitline signal to the first stage based on a selected write wordline signal from at least one write wordline port of the write wordline ports and also based on a selected bitline signal based on at least one write bitline port of the write bitline ports.

* * * * *